US009735239B2

(12) United States Patent
Doornbos et al.

(10) Patent No.: US 9,735,239 B2
(45) Date of Patent: Aug. 15, 2017

(54) SEMICONDUCTOR DEVICE CHANNEL SYSTEM AND METHOD

(75) Inventors: Gerben Doornbos, Leuven (BE); Krishna Kumar Bhuwalka, Asansol (IN); Matthias Passlack, Huldenberg (BE)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 780 days.

(21) Appl. No.: 13/444,695

(22) Filed: Apr. 11, 2012

(65) Prior Publication Data
US 2013/0270607 A1 Oct. 17, 2013

(51) Int. Cl.
*H01L 29/66* (2006.01)
*H01L 29/205* (2006.01)
*H01L 29/10* (2006.01)
*H01L 29/78* (2006.01)

(52) U.S. Cl.
CPC ........ *H01L 29/205* (2013.01); *H01L 29/1054* (2013.01); *H01L 29/66795* (2013.01); *H01L 29/785* (2013.01)

(58) Field of Classification Search
None
See application file for complete search history.

(56) References Cited

U.S. PATENT DOCUMENTS

| 6,080,995 A | 6/2000 | Nomoto | |
| 7,799,592 B2 | 9/2010 | Lochtefeld | |
| 8,823,102 B2 * | 9/2014 | van Dal | H01L 29/66431 257/347 |
| 2005/0184316 A1 | 8/2005 | Kim et al. | |
| 2005/0279992 A1 * | 12/2005 | Gupta | H01L 21/823807 257/24 |
| 2006/0076625 A1 * | 4/2006 | Lee et al. | 257/353 |
| 2006/0131673 A1 * | 6/2006 | Shimizu et al. | 257/410 |
| 2006/0157733 A1 * | 7/2006 | Lucovsky et al. | 257/192 |
| 2007/0020860 A1 * | 1/2007 | Mears | B82Y 10/00 438/285 |
| 2010/0252816 A1 | 10/2010 | Ko et al. | |
| 2011/0024794 A1 | 2/2011 | Ko et al. | |

(Continued)

FOREIGN PATENT DOCUMENTS

| CN | 1770470 A | 5/2006 |
| CN | 101681924 A | 3/2010 |

(Continued)

OTHER PUBLICATIONS

English Translation of Hisashi et al. [JP 2010-129974] (machine translation).*

(Continued)

*Primary Examiner* — Mark Tornow
*Assistant Examiner* — Priya Rampersaud
(74) *Attorney, Agent, or Firm* — Slater Matsil, LLP

(57) ABSTRACT

A system and method for a channel region is disclosed. An embodiment comprises a channel region with multiple bi-layers comprising alternating complementary materials such as layers of InAs and layers of GaSb. The alternating layers of complementary materials provide desirable band gap characteristics for the channel region as a whole that individual layers of material may not.

20 Claims, 14 Drawing Sheets

(56) References Cited

U.S. PATENT DOCUMENTS

| | | | |
|---|---|---|---|
| 2011/0147711 A1* | 6/2011 | Pillarisetty | B82Y 10/00 257/24 |
| 2011/0193091 A1* | 8/2011 | Passlack | H01L 21/823807 257/76 |
| 2011/0193134 A1 | 8/2011 | Passlack | |
| 2012/0074386 A1* | 3/2012 | Rachmady et al. | 257/24 |
| 2013/0099283 A1* | 4/2013 | Lin | H01L 29/267 257/190 |
| 2013/0277714 A1* | 10/2013 | Le | H01L 29/42392 257/190 |
| 2015/0084000 A1 | 3/2015 | Chui et al. | |

FOREIGN PATENT DOCUMENTS

| | | |
|---|---|---|
| JP | 2010129974 A | 6/2010 |
| KR | 100487566 | 5/2005 |
| KR | 100533293 | 4/2006 |
| KR | 1020110013257 A | 2/2011 |
| TW | 201104867 | 2/2011 |
| TW | 201114037 | 4/2011 |
| TW | 201128776 | 8/2011 |

OTHER PUBLICATIONS

Thelander, C., et al., "Vertical Enhancement-Mode InAs Nanowire Field-Effect Transistor with 50-nm Wrap Gate," IEEE Electron Device Letters, vol. 29, No. 3, Mar. 2008, pp. 206-208.

Radosavljevic, B., et al., "Advanced High-K Gate Dielectric for High-Performance Short-Channel $In_{0.7}Ga_{0.3}As$ Quantum Well Field Effect Transistors on Silicon Substrate for Low Power Logic Applications," IEEE, 2009, 4 pages.

Passlack, M., et al., "Suitability Study of Oxide/Gallium Arsenide Interfaces for MOSFET Applications," IEEE Transactions on Electron Devices, vol. 57, No. 11, Nov. 2010, 13 pages.

Egard, M., et al., "High Transconductance Self-Aligned Gate-Last Surface Channel $In_{0.53}Ga_{0.47}As$ MOSFET," IEEE, 2011, 4 pages.

Trinh, H. D., et al., "Electrical Characterization of $Al_2O_3$/n-InAs Metal-Oxide-Semiconductor Capacitors with Various Surface Treatments," IEEE Electron Device Letters, vol. 32, No. 6, Jun. 2011, pp. 752-754.

Cinkilic, E., "Comparison of Interface State Spectroscopy Techniques by Characterizing Dielectric—InGaAs Interfaces, " Thesis Presented in Partial Fulfillment of the Requirements for the Degree Master of Science in the Graduate School of the Ohio State University, 2013, 98 pages.

* cited by examiner

SEMICONDUCTOR DEVICE CHANNEL SYSTEM AND METHOD

BACKGROUND

Generally, semiconductor devices such as transistors may be formed in semiconductor materials from column IV of the periodic table such as silicon, germanium, etc., that have been doped with various dopants such as p-type dopants and n-type dopants. These semiconductor materials may have an energy gap between a valence band and a conduction band known as a band gap that is larger than a conductor (in which the valence band and conduction band may overlap) and smaller than an insulator (in which the valence band and conduction band are so far apart as to effectively prevent electrical conduction). These semiconductor materials, along with the different types of dopants, may be utilized along with a gate dielectric and a gate electrode to define a channel region wherein the flow of current can be controlled by the selective application of voltage to the gate electrode.

Recently, there has been much research into using materials other than the semiconductor materials from column IV of the periodic table. Materials that are being researched include a combination of elements from both column III and column V of the periodic table, known as III-V materials. These III-V materials may have a band gap that allows for their usage as semiconductor materials.

However, while the III-V materials may be used as a substitute for the semiconductor materials from column IV, the materials themselves leave much to be desired when it comes to using these materials in the mass production of devices for usage by consumers. As merely one example, the conduction band and valence band energies of many of the III-V materials, while still functional, may be ill-suited for actual usage. Additionally, the trap density at the interface between many of the III-V materials and the gate dielectric may be exceedingly high as compared to materials from column IV of the periodic table.

BRIEF DESCRIPTION OF THE DRAWINGS

For a more complete understanding of the present embodiments, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

Embodiments will be described with respect to a specific context, namely a FinFET transistor. Other embodiments may also be applied, however, to other semiconductor devices, such as planar transistors or other semiconductor devices.

Figure 1:
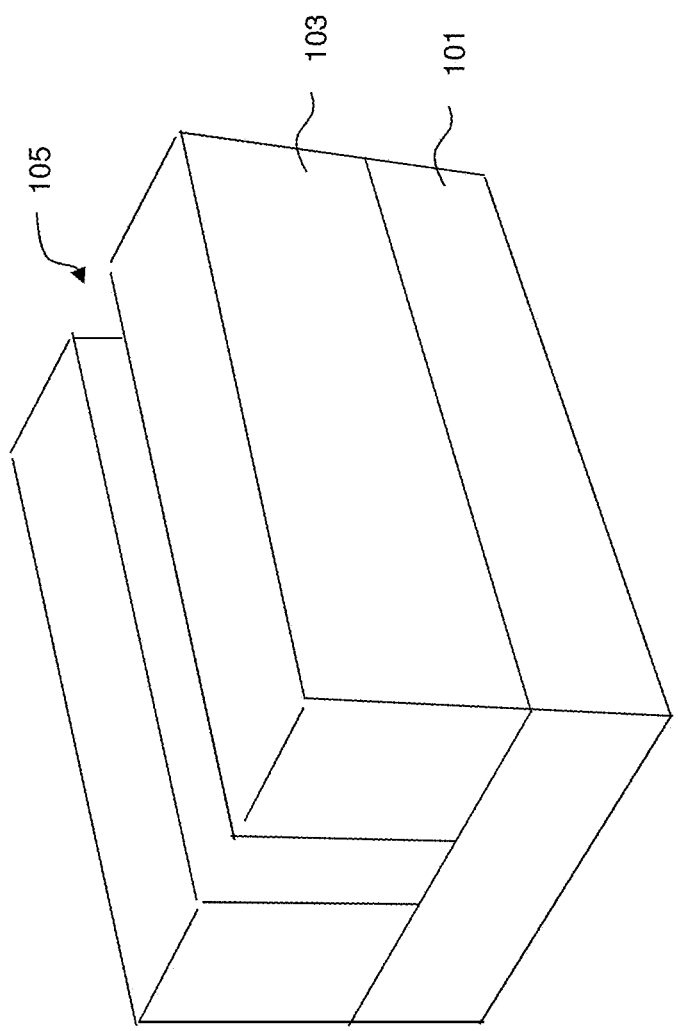
FIG. 1 illustrates a semiconductor substrate with an isolation region and a trench in accordance with an embodiment.

With reference now to FIG. 1, there is shown a simplified portion of a substrate 101 with an isolation region 103 formed therein. The substrate 101 may be a semiconductor material such as silicon, germanium, diamond, or the like, with a crystal orientation of (001). Alternatively, compound materials such as silicon germanium, silicon carbide, gallium arsenide, indium arsenide, aluminum arsenide, gallium antimonide, indium antimonide, aluminum antimonide, indium phosphide, combinations of these, and the like, with other crystal orientations, may also be used. Additionally, the substrate 101 may comprise a silicon-on-insulator (SOI) substrate. Generally, an SOI substrate comprises a layer of a semiconductor material such as epitaxial silicon, germanium, silicon germanium, SOI, silicon germanium on insulator (SGOI), or combinations thereof. The substrate 101 may be doped with an n-type dopant, such as phosphorous, arsenic, or the like, as is known in the art although the substrate may alternatively be doped with a p-type dopant, such as boron, indium, aluminum, gallium, or the like.

Formed in the substrate 101 is the isolation region 103 with a trench 105 formed therein. The isolation region 103 may be, e.g., a shallow trench isolation generally formed by etching the substrate 101 to form a trench and filling the trench with dielectric material as is known in the art. The isolation region 103 may be filled or overfilled with a dielectric material such as an oxide material, a high-density plasma (HDP) oxide, or the like, and may be formed by methods known in the art. Once filled or overfilled the dielectric material may be planarized using a process such as, e.g., a chemical mechanical polish (CMP). The isolation region 103 may have a depth of between about 100 nm and about 400 nm, such as about 250 nm.

Once the isolation region 103 has been formed, the trench 105 may be formed by removing the substrate 101 from within the isolation region 103. In an embodiment, the trench 105 may be formed by etching the substrate 101 not protected by the isolation region 103 using, e.g., an anisotropic or isotropic etch process until the substrate 101 has been removed to form the trench 105. However, any suitable alternative process, such as forming the isolation region 103 and then removing a portion of the isolation region 103 to form the trench 105, may alternatively be utilized.

Figure 2:
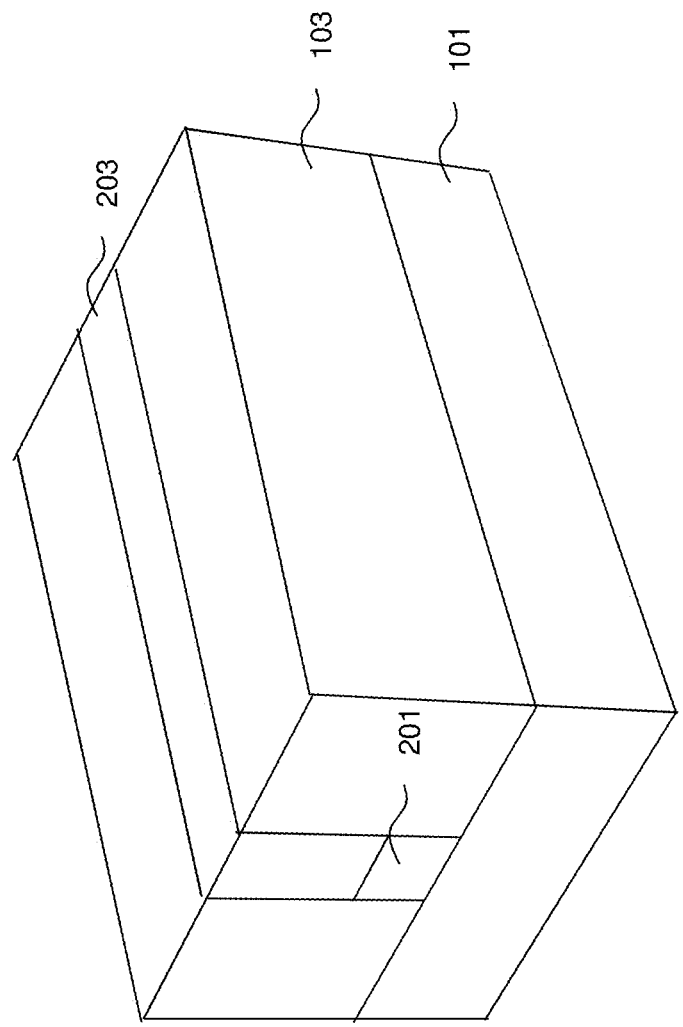
FIG. 2 illustrates a formation of a template layer and an isolation layer in accordance with an embodiment.

FIG. 2 illustrates the formation of a template layer 201 and an insulator layer 203 within the trench 105. In an embodiment the template layer 201 may be used to accommodate for any lattice mismatch that may occur between the substrate 101 (e.g., silicon) and the insulator layer 203 and to also act as a nucleating site for the insulator layer 203. As such, while the precise material of the template layer 201 may be at least in part dependent upon the materials chosen for the substrate 101 and the insulator layer 203, in an embodiment in which the substrate 101 is silicon and the insulator layer 203 is AlAsSb, the template layer 201 may be indium arsenide (InAs), although any other suitable material may alternatively be utilized.

The template layer 201 may be formed using an epitaxial growth process such as molecular beam epitaxy (MBE), metal organic chemical vapor deposition (MOCVD), MOVPE, combinations of these, or the like in order to grow the template layer 201 on the underlying substrate 101. In an embodiment the template layer 201 may be formed to have a thickness within the trench 105 of between about 50 nm, and about 150 nm, such as about 100 nm. However, any other suitable processes and thicknesses may be utilized to help accommodate for the lattice mismatch between the substrate 101 and the insulator layer 203.

Once the template layer 201 has been formed on the substrate 101 within the trench 105, the insulator layer 203 may be grown on top of the template layer 201 using the template layer 201 as a nucleating layer. In an embodiment the insulator layer 203 may be a wide band gap material utilized to electrically isolate the channel region 301 (not illustrated in FIG. 2 but illustrated and discussed further below with respect to FIG. 3) from the template layer 201. As such, the insulator layer 203 may be a material such as $AlAs_xSb_{1-x}$, although other suitable materials, such as AlAsSb, AlSb, InP, or $Al_{0.52}Ga_{0.48}As$, combinations of these, or the like, may alternatively be utilized. In particular embodiments in which it is desired that the insulator layer 203 has a similar lattice constant as the channel region 301 (not illustrated in FIG. 2 but illustrated and discussed below with respect to FIG. 3), the insulator layer 203 may be a material such as, e.g., $AlAs_{0.16}Sb_{0.84}$.

Additionally, other embodiments may include forming the insulator layer 203 to provide a stress to the channel region 301. For example, while the material $AlAs_{0.16}Sb_{0.84}$ was utilized to describe the insulator layer 203 above when a lattice match is desired, other compositions of AlAsSb may be utilized to provide for different stresses within the channel region 301. In an embodiment in which tensile stress is desired within the channel region 301, a larger amount of Sb, such as 100%, may be included while a smaller amount of As, such as 0%, may be utilized. Alternatively, if a compressive stress is desired within the channel region 301, a larger amount of As, such as 70%, may be utilized, while a smaller amount of Sb, such as 30%, may be utilized. These and any other composition utilized to generate stress within the channel region 301 may be utilized and are fully intended to be included within the scope of the embodiments.

The insulator layer 203 may be formed using an epitaxial growth process such as MBE, MOCVD, MOVPE, combinations of these, or the like, in order to grow the insulator layer 203 over the template layer 201. The insulator layer 203 may be formed to partly fill, completely fill or overfill the remaining portion of the trench 105 not filled by the template layer 201. Once formed to fill or overfill the trench 105, the insulator layer 203 and the isolation region 103 may be planarized using a planarization process such as a chemical mechanical polish (CMP). Optionally, after the insulator layer 203 and the isolation region 103 have been planarized, the insulator layer 203 may be recessed or etched back such that subsequent layers (described further below with respect to FIG. 3A) may be grown inside the trench 105.

Figure 3A:
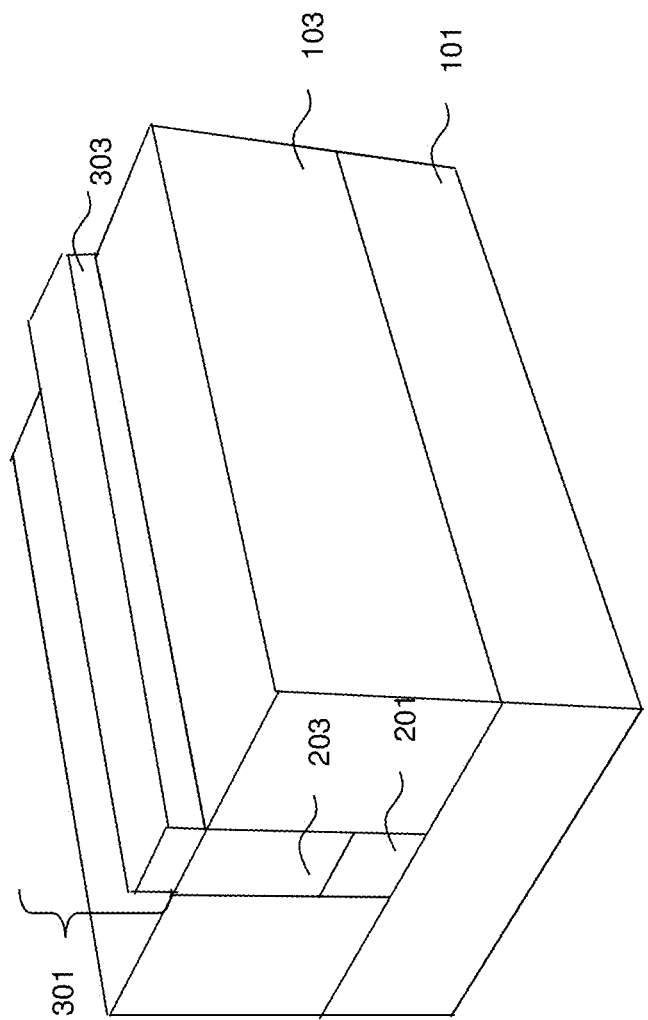
FIGS. 3A-3B illustrate a formation of a first layer in a channel region in accordance with an embodiment.
Figure 3B:
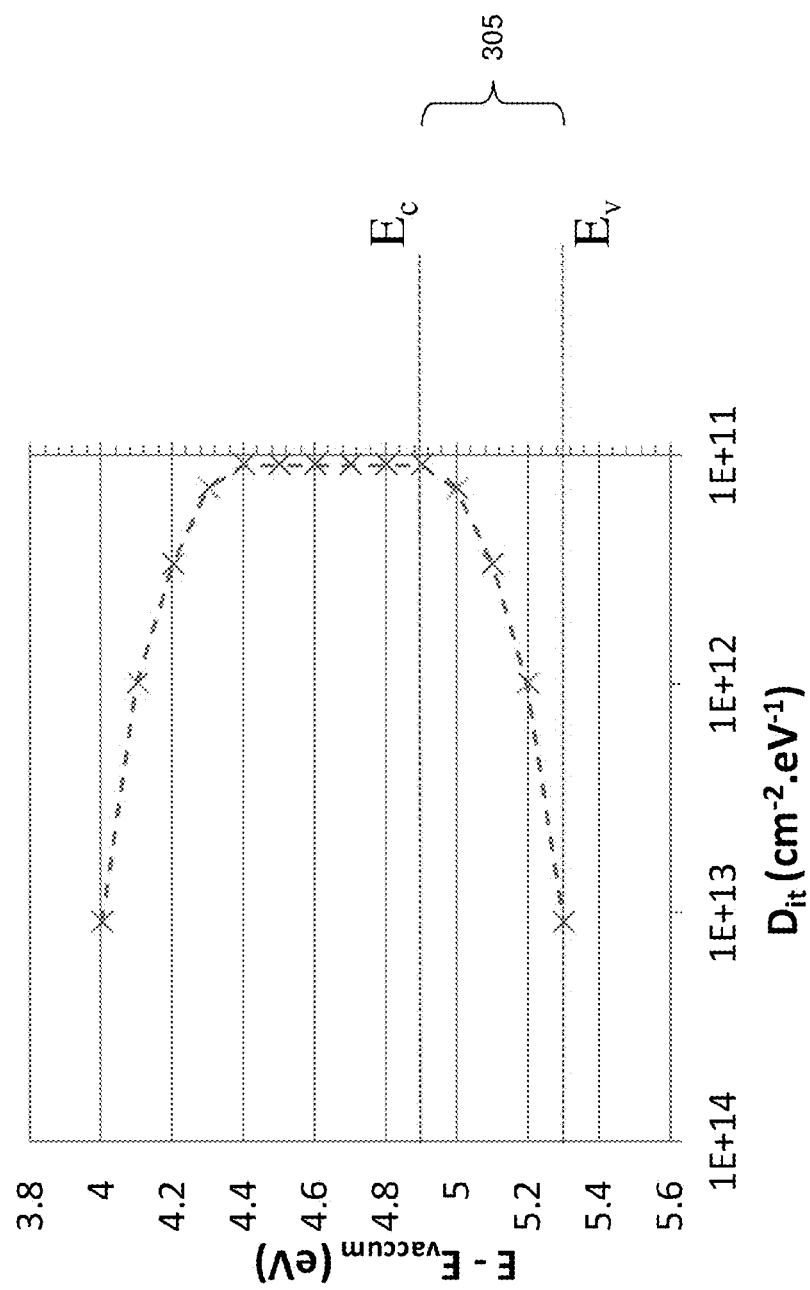

FIGS. 3A-3B illustrate an initial step in a formation of a channel region 301 on the insulator layer 203. Looking first at FIG. 3A, the channel region 301 may be initiated by forming a first layer 303 of a material that has properties that may be both desirable for a channel and also may be not as desirable for a channel. In an embodiment the first layer 303 may comprise a layer of indium arsenide (InAs), although other suitable III-V materials, such as InAsSb, InGaAs, GaAsSb, combinations of these, or the like, may alternatively be utilized.

FIG. 3B illustrates some of the properties of InAs that make it both desirable and not as desirable as a material for the channel region 301. In particular, FIG. 3B illustrates a plot of InAs's energies plotted against the interface trap density ($D_{it}$) at each energy level, with InAs's band gap 305 (the gap between InAs's conduction band energy level $E_c$ and InAs's valence band energy level $E_v$) also illustrated. As can be seen, while the band gap 305 is low and attractive for nFET operation, the interface trap density rises to a high level within the band gap 305 as compared to the relatively low number for the interface trap density that may be seen at energy levels right outside of the band gap (e.g., at a level above the conduction band energy level $E_c$). Given both of these desirable and not as desirable properties of the first layer 303 (e.g., InAs), for the overall channel region 301 the properties of the first layer 303 may be modulated with the second layer 401 (not illustrated in FIGS. 3A-3B but illustrated and described below with respect to FIGS. 4A-4B).

The first layer 303 may be formed using a suitable epitaxial growth process, such as MBE, MOCVD, MOVPE, combinations of these, or the like to grow the first layer 303 on the insulator layer 203. To help the properties of the first layer 303 to be modulated with the properties of the second layer 401, the first layer 303 may be formed to have a thickness between about 0.6 nm and about 5 nm, such as about 4 monolayers, with each monolayer being about 0.3 nm in thickness.

Figure 4A:
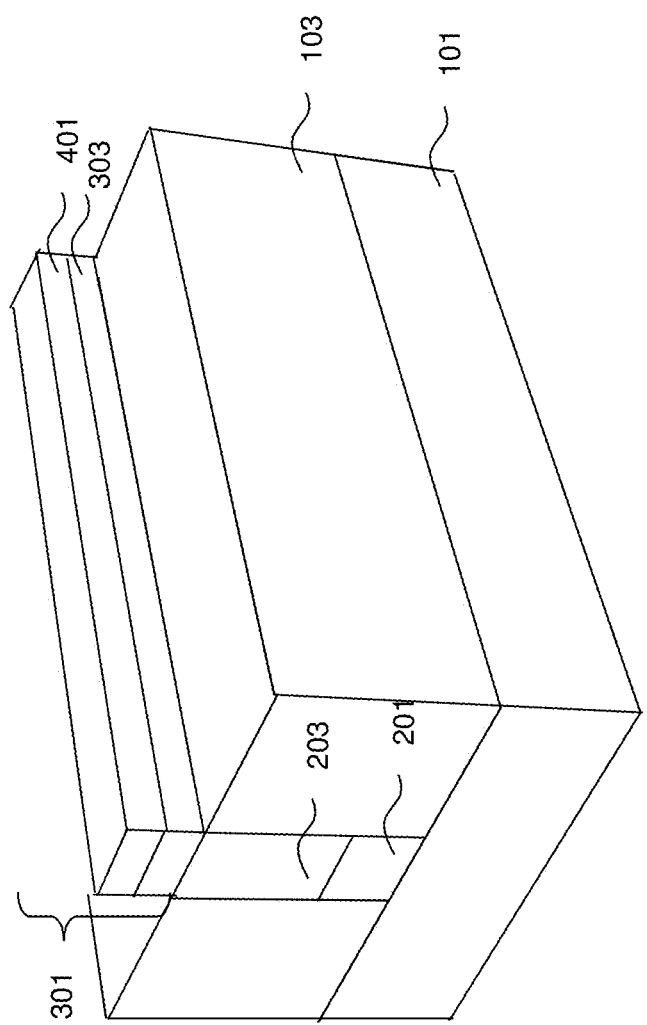
FIGS. 4A-4B illustrate a formation of a second layer in a channel region in accordance with an embodiment.
Figure 4B:
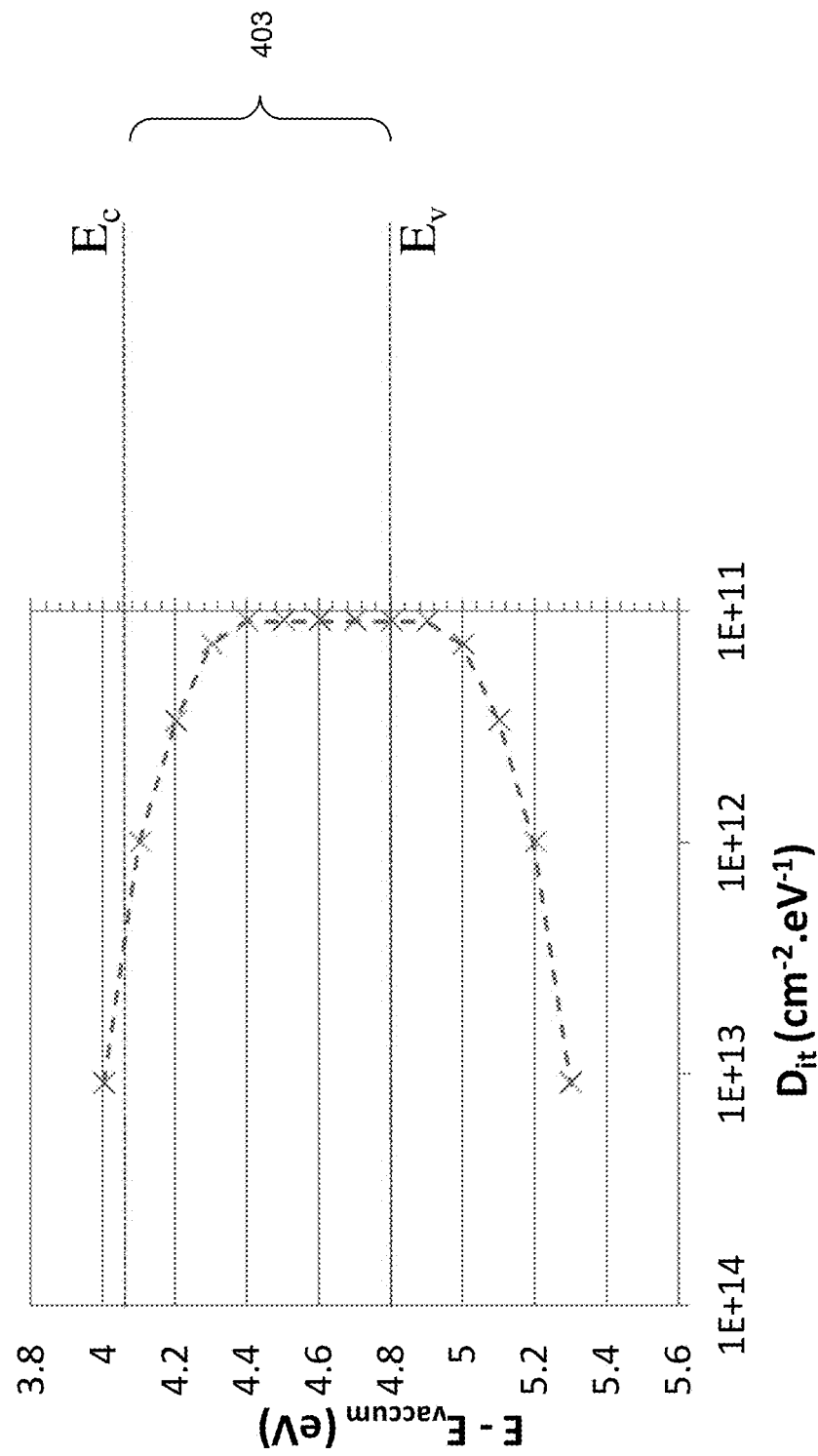

FIGS. 4A-4B illustrate the formation of a second layer 401 over the first layer 303 to form a bi-layer in the channel region 301 after the first layer 303 has been grown. The second layer 401 may be another material that may have properties that are both desirable and not as desirable, and which may also complement the properties of the first layer 303 in order to modulate the properties of the first layer 303 in the channel region 301. As such, while the precise material chosen for the second layer 401 may be dependent at least in part upon the desired properties of the channel region 301 and the material chosen for the first layer 303, in an embodiment in which InAs is chosen for the first layer 303, the second layer 401 may be, e.g., a material such as gallium antimonide (GaSb). However, other suitable materials, such as $In_yGa_{1-y}Sb$, InP, combinations of these, or the like, may alternatively be utilized.

FIG. 4B illustrates a plot of GaSb's energies plotted against the interface trap density ($D_{it}$) at each energy level for GaSb by itself (and not when paired with InAs), with GaSb's band gap 403 (the gap between GaSb's conduction band energy level $E_c$ and GaSb's valence band energy level $E_v$) also illustrated. As can be seen, while GaSb's band gap 403 extends over a region of low interface trap density, GaSb's band gap 403 also extends over a region of high interface trap density as well. As such, while the interface trap density of GaSb may be held low, GaSb's band gap 403 may also enter a region where the interface trap density is not held low.

Returning to FIG. 4A, the second layer 401 may, similar to the first layer 303, be formed utilizing an epitaxial growth process such as MBE, MOCVD, MOVPE, combinations of these, or the like. The second layer 401 may be formed to have a thickness of between about 0.6 nm and about 5 nm, such as about 4 monolayers. However, other processes, materials, and thicknesses may alternatively be utilized while remaining within the scope of the embodiments.

However, after the second layer 401 is formed on the first layer 303 as described, the properties of overall channel region 301 that includes both the first layer 303 and the second layer 401 may be modulated from either the properties of either the first layer 303 or the second layer 401 individually. In other words, by forming both the first layer 303 and the second layer 401, the properties of the second layer 401 may be used to tune and modulate the properties of the first layer 303 and the properties of the first layer 303 may be utilized to modulate and tune the properties of the second layer 401. For example, while each one of the first layer 303 and the second layer 401 may have properties that are not ideal, the overall channel region 301 may have properties that, collectively, have been modulated to a more desired range.

Figure 5:
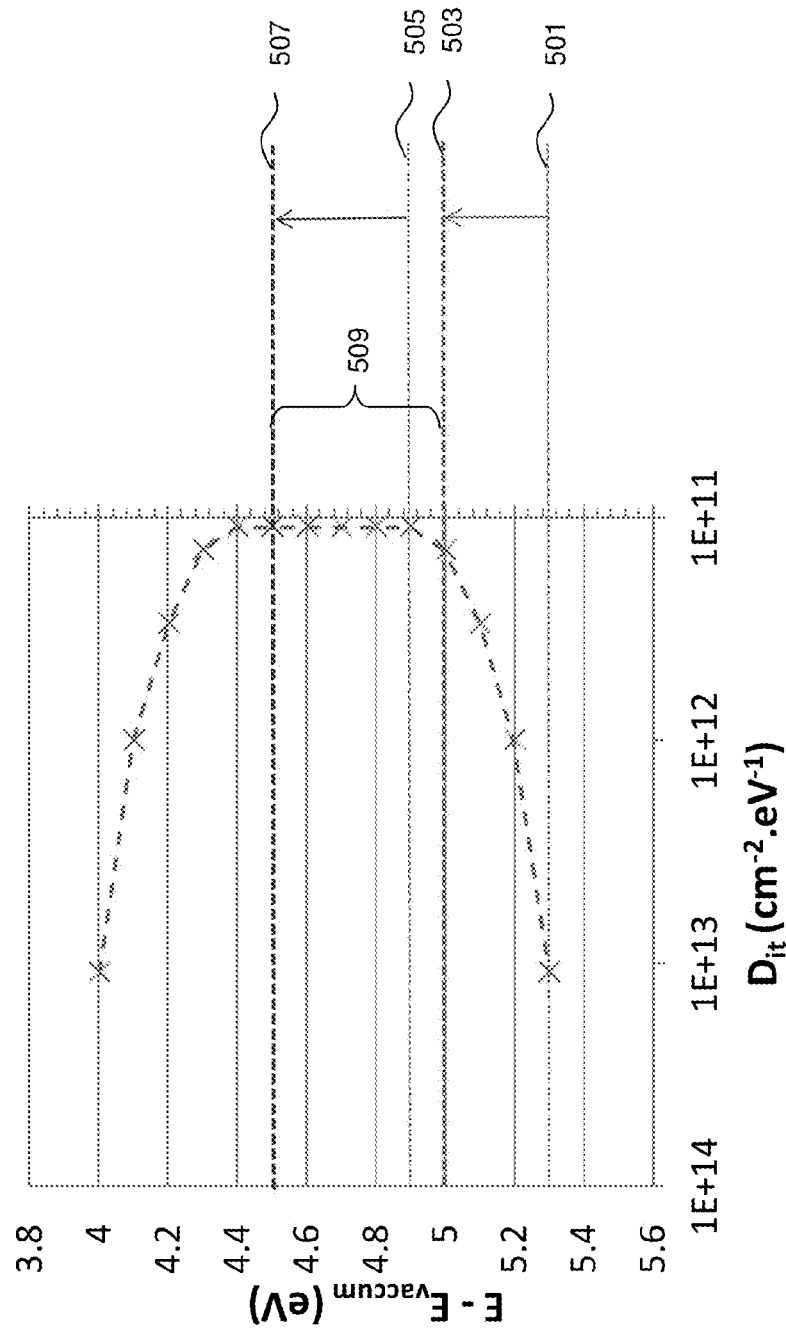
FIG. 5 illustrates a modulation of a band gap for the channel region in accordance with an embodiment.

FIG. 5 illustrates the properties of such a composite channel region 301 utilizing InAs as the first layer 303 and GaSb as the second layer 401 whereby the quantum mechanical confinement in the first layer 303 and the second layer 401 may be used to change the effective band gap (represented in FIG. 5 by the gap 509) of the channel region 301. In particular, by utilizing the second layer 401 (e.g., GaSb) to modulate the properties of the first layer 303 (e.g., InAs), InAs's original valence band energy (represented in FIG. 5 by line 501) may be moved upwards to a modulated valance band energy level (represented in FIG. 5 by line 503). Additionally, InAs's original conduction band energy level (represented in FIG. 5 by line 505) may also be moved upwards to a modulated conduction band energy level (represented in FIG. 5 by line 507).

Additionally, by moving the valence band energy level and the conduction band energy levels upwards, the modulated band gap 509 of the composite channel region 301 is also moved upwards (relative to the chart in FIG. 3B), and the modulated band gap 509 also covers an energy level where the interface trap defects may be kept at a low level instead of being in a region of high interface trap densities (as in FIG. 3B). As such, a small band gap may be obtained without having to sacrifice the interface trap density, and a low interface trap density may be obtained while also maintaining a small band gap. With a lower interface trap density, there is a lowered or eliminated degradation of the drive current ($I_{on}$) and/or the off-state current $I_{off}$, thereby leading to a more ideal switching behavior of the device.

Figure 6:
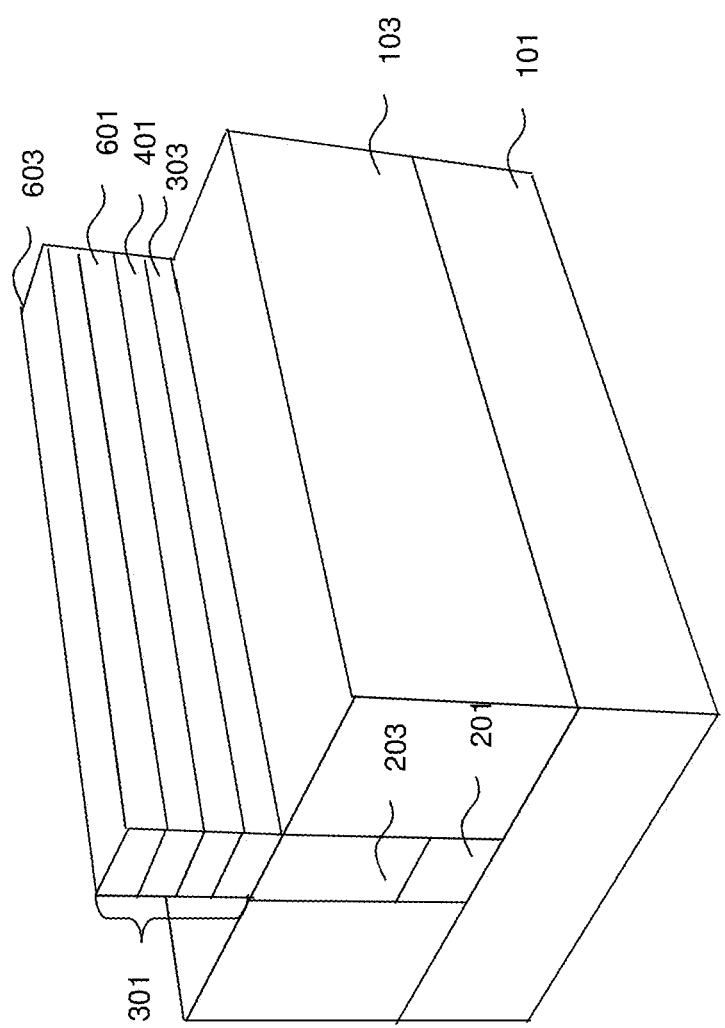
FIG. 6 illustrates the formation of further layers in the channel region in accordance with an embodiment.

FIG. 6 illustrates a repeating of the formation of the first layer 303 and the second layer 401 to form a second bi-layer with a third layer 601 and a fourth layer 603, respectively, in the channel region 301. By repeating these steps the total thickness of the channel region 301 may be increased by building up successive layers. In an embodiment, the third layer 601 may be similar to the first layer 303 (e.g., InAs) and may be grown on the second layer 401, and the fourth layer 603 may be similar to the second layer 401 (e.g., GaSb) and may be grown on the third layer 601. The processes and materials used for the third layer 601 and the fourth layer 603 may be similar to the processes and materials described above for the first layer 303 and the second layer 401, respectively.

Additionally, while the repetition of the forming the first layer 303 and the second layer 401 is illustrated with one repetition in FIG. 6 (to form the third layer 601 and the fourth layer 603), this repetition may continue to grow successive layers over the fourth layer 603 until the channel region 301 has a desired thickness. In an embodiment the desired thickness may be between about 5 layers of InAs, or between about 5 nm and about 10 nm. However, any other suitable thickness may alternatively be utilized while remaining within the scope of the embodiments.

In another embodiment, the same material may be used for the first layer 303 and the last layer formed in the channel region 301. For example, in an embodiment in which InAs is utilized for the first layer 303, the last layer formed in the channel region 301 may also be InAs formed after one of the iterations of GaSb. Any suitable combination of the first layer 303 and the second layer 401 may alternatively be utilized to form the channel region 301.

Alternatively, while the first layer 303 and the second layer 401 have been described above as having similar thicknesses (such as the first layer 303 and the third layer 601 having a thickness of four monolayers while the second layer 401 and the fourth layer 603 have a thickness of about four monolayers), the embodiments are not intended to be limited as such. Rather, the properties of the channel region 301 (e.g., the band gap) may be further tuned by modulating the number of individual layers and the thickness of each layer relative to each other. For example, in another embodiment the second layer 401 and the fourth layer 603 may have a different thickness than the first layer 303 and the third layer 601. For example, the second layer 401 and the fourth layer 603 may have a greater thickness than the first layer 303 and the third layer 601, such as having a thickness of about eight monolayers while the second layer 401 and the fourth layer 603 have a thickness of about four monolayers.

Figure 7A:
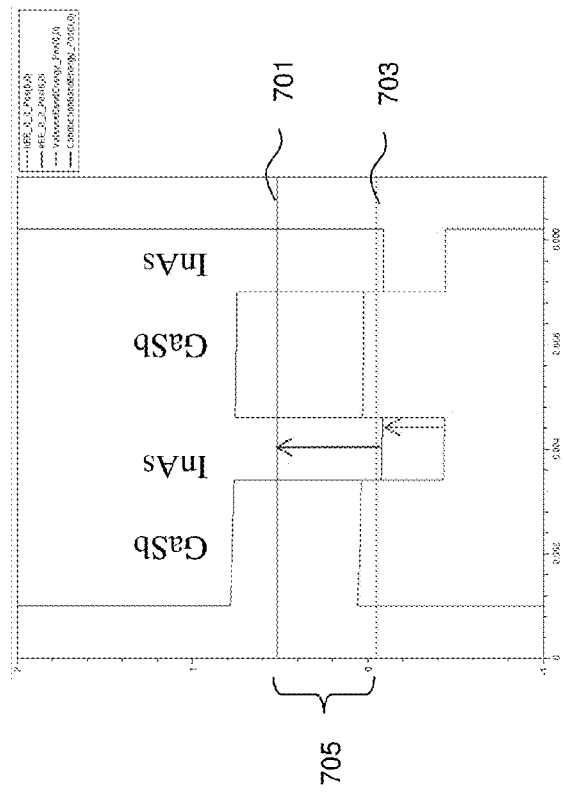
FIGS. 7A-7C illustrate a modulation of properties of the channel region by adjusting the thickness of layers within the channel region in accordance with an embodiment.
Figure 7B:
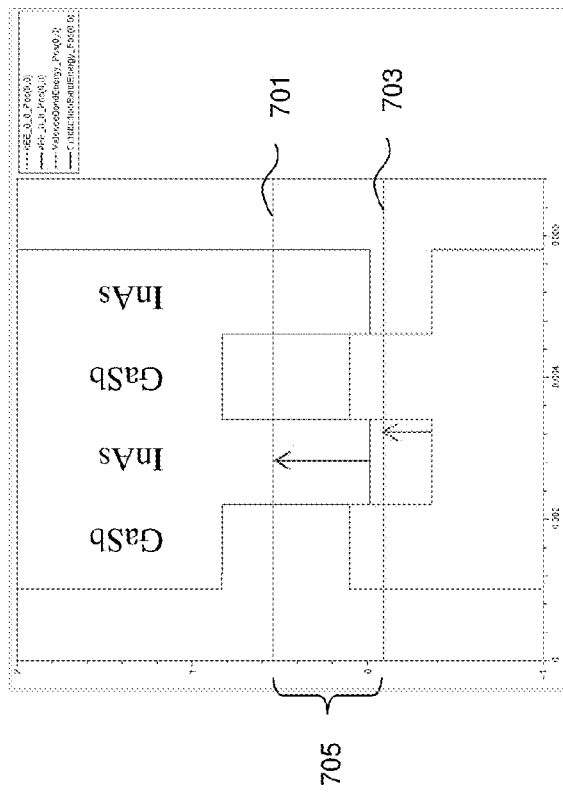

FIGS. 7A and 7B illustrate simulations that illustrate this concept of tuning the channel region 301 by varying the thickness of the individual layers relative to each other. FIG. 7A illustrates the conduction band and valence band movements for the channel region 301 comprising the first layer 303, the second layer 401, the third layer 601, and the fourth layer 603 as described above (with the first layer 303 and the third layer being four monolayers thick and the second layer 401 and fourth layer 603 also being four monolayers thick). However, FIG. 7B illustrates a similar structure but with the second layer 401 and the fourth layer 603 being twice the thickness of the first layer 303 and the third layer 601, respectively, such as being eight monolayers thick.

As can be seen, the final level of the modulated conduction band energy level and the modulated valence band energy level for the channel region 301 may be varied by varying the relative thicknesses of the different layers. For example, by increasing the thickness of the second layer 401 and the fourth layer 603 relative to the first layer 303 and the third layer 601, the modulated conduction band energy level 701 in FIG. 7B (with varying thicknesses) is lower than in FIG. 7A (where all of the layers are equal thicknesses). Similarly, the modulated valence band energy level 703 in FIG. 7B is higher than in FIG. 7A. As such, the modulated band gap 705 in FIG. 7B is smaller than the modulated band gap 705 in FIG. 7A, and the band gap 705 may be tuned by adjusting the thicknesses of the individual layers relative to each other.

Figure 7C:
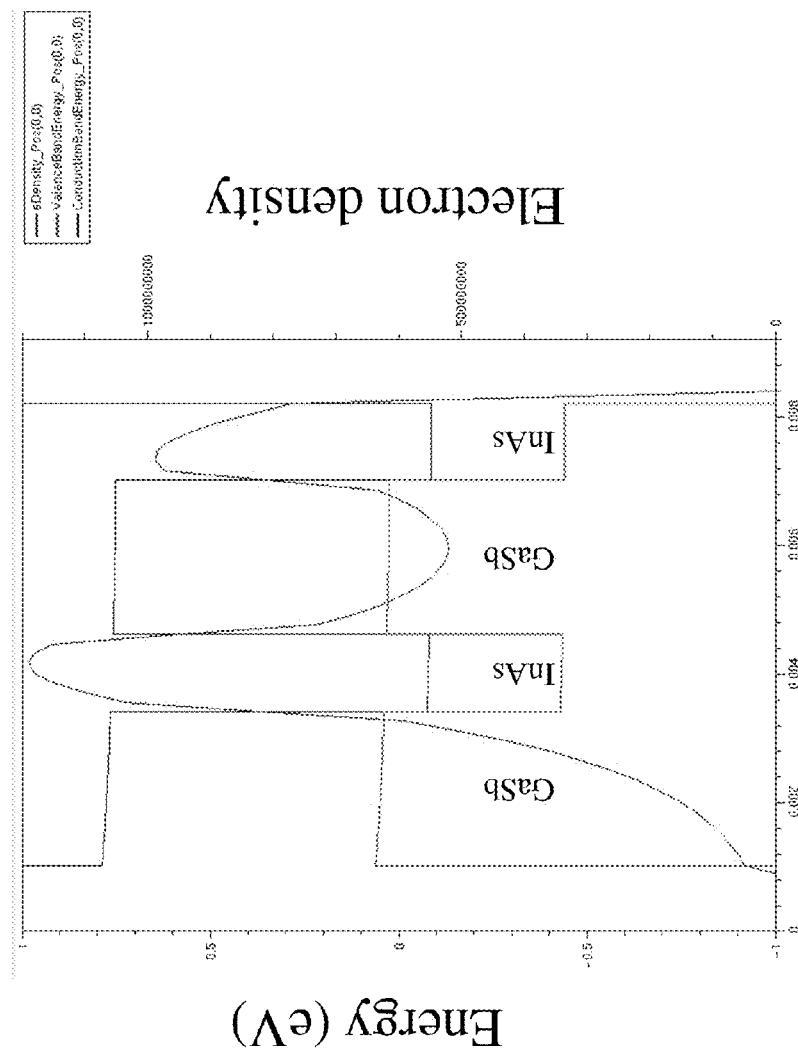

Additionally, FIG. 7C illustrates an electron density chart of the embodiment in which the second layer 401 and the fourth layer 603 have a larger thickness than the first layer 303 and the third layer 601. As can be seen, the highest electron density may be found in the first layer 303 and the third layer 601 (e.g. InAs), while the electron density is relatively low in the second layer 401 and fourth layer 603 (e.g. GaSb). As such, since, e.g., InAs has by far the highest electron mobility, the channel region 301 maintains its overall high electron mobility $\mu_e$.

Figure 8A:
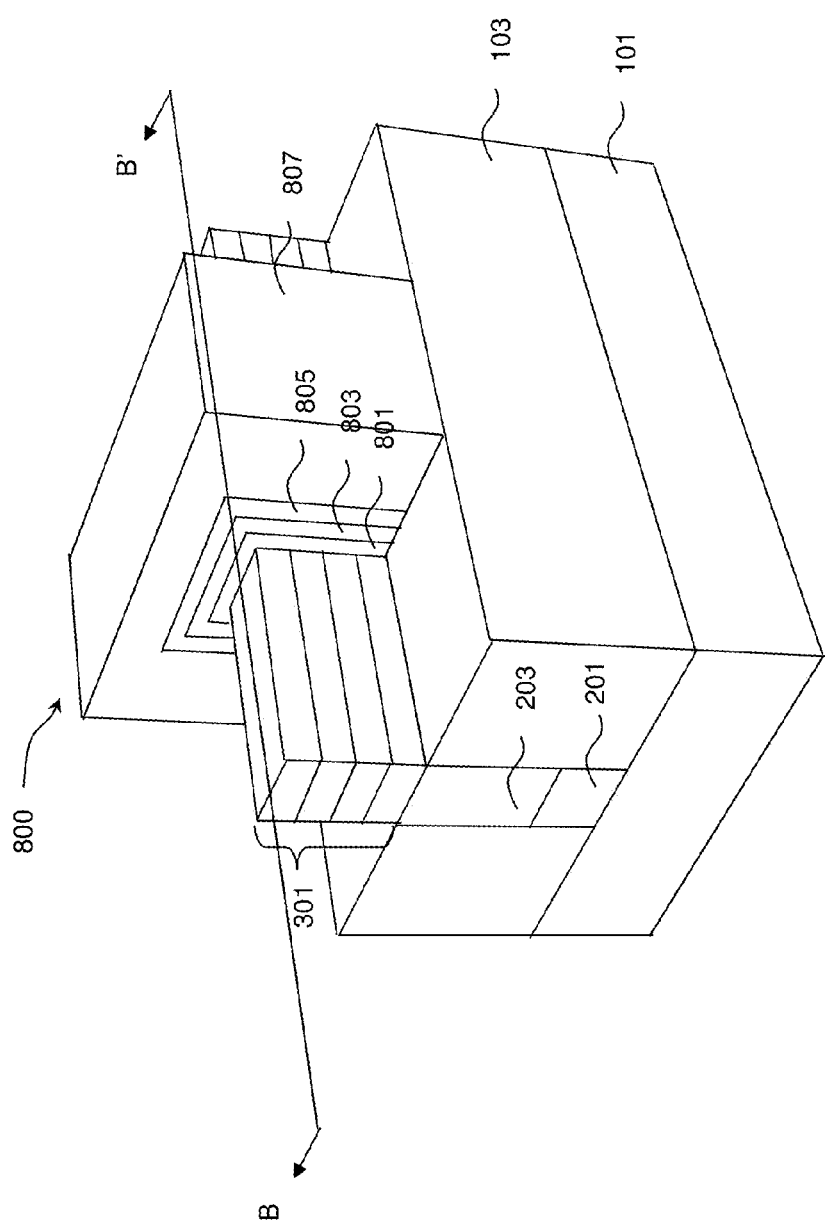
FIGS. 8A-8B illustrate a formation of a gate stack over the channel region in accordance with an embodiment.
Figure 8B:
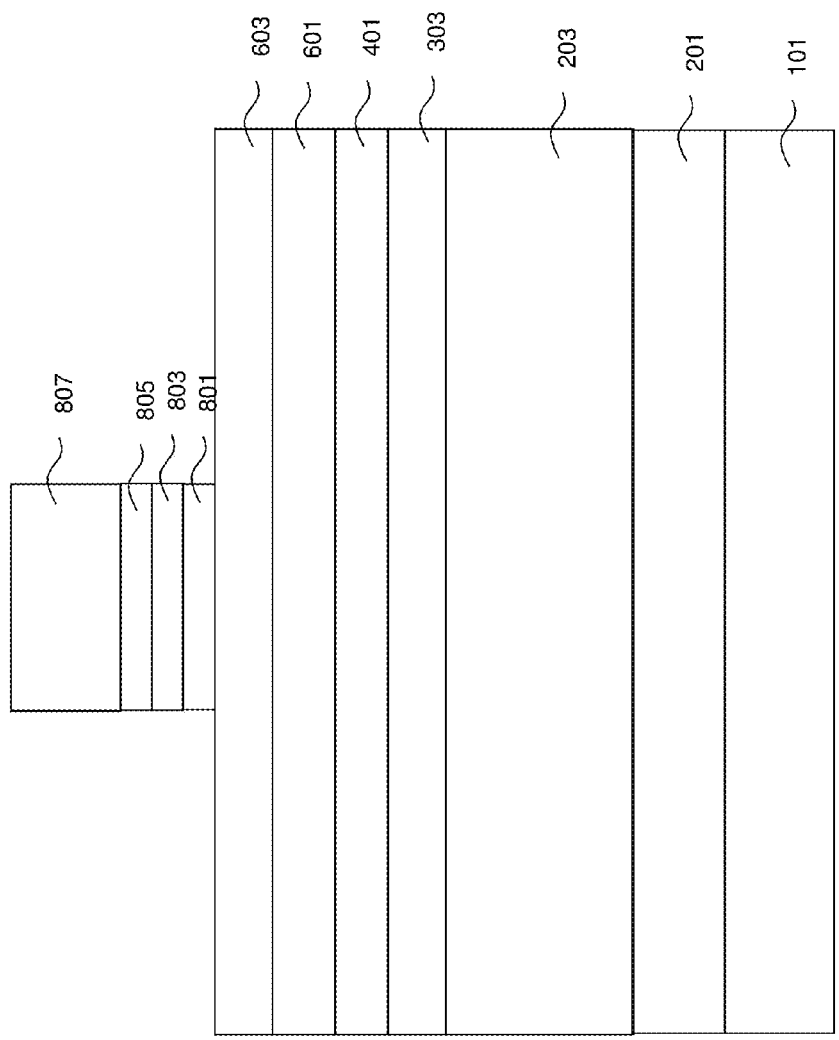

FIGS. 8A-8B illustrate a formation of a gate stack 800 with an optional first passivation layer 801, an optional second passivation layer 803, a gate dielectric 805, and a gate electrode 807, with FIG. 8B illustrating a cross-sectional view of FIG. 8A along line B-B'. In an embodiment the first passivation layer 801 may be formed on the fourth layer 603 and may be, for example, GaSb, although other suitable materials may be utilized. The first passivation layer 801 may be formed using an epitaxial process such as MBE, MOCVD, MOVPE, combinations of these, or the like, and may be formed to have a thickness of between about 0.3 nm and about 2 nm, such as about 0.6 nm.

The second passivation layer 803 may be formed over the first passivation layer 801. The second passivation layer 803 may be an interfacial layer and may be formed of a material such as $Ga_2O_3$ although other suitable materials, such as $Al_2O_3$, $TaSiO_x$, combinations of these, or the like, may alternatively be utilized. The second passivation layer 803 may be formed using an deposition process such as ALD, MBD, combinations of these, or the like, and may be formed to have a thickness of between about 0.4 nm and about 2 nm, such as about 1 nm.

The gate dielectric 805 may be formed over the second passivation layer 803 and may comprise a material such as a high permittivity (high-k) material (e.g., with a relative permittivity greater than about 3.9) such as lanthanum oxide ($La_2O_3$), aluminum oxide ($Al_2O_3$), hafnium oxide ($HfO_2$), hafnium oxynitride (HfON), or zirconium oxide ($ZrO_2$), tantalum silicon oxide ($TaSiO_x$), or combinations thereof, with an equivalent oxide thickness of about 0.5 angstroms to about 100 angstroms, such as about 30 angstroms or less. The gate dielectric 805 may alternatively be formed from silicon dioxide or silicon oxynitride with a thickness ranging from about 3 angstroms to about 100 angstroms, such as about 30 angstroms. Additionally, any combination of silicon dioxide, silicon oxynitride, and/or high-k materials may also be used for the gate dielectric 805.

The gate dielectric may be formed using ALD, MBD, chemical vapor deposition, sputtering, thermal oxidation, or any other methods known and used in the art for forming a gate dielectric. Depending on the technique of gate dielectric formation, the gate dielectric 805 thickness on the top of the channel region 301 may be different from the gate dielectric thickness on the sidewall of the channel region 301.

The gate electrode 807 may comprise a conductive material and may be selected from a group comprising of polycrystalline-silicon (poly-Si), poly-crystalline silicon-germanium (poly-SiGe), metallic nitrides, metallic silicides, metallic oxides, metals, combinations of these, and the like. Examples of metallic nitrides include tungsten nitride, molybdenum nitride, titanium nitride, and tantalum nitride, or their combinations. Examples of metallic silicide include tungsten silicide, titanium silicide, cobalt silicide, nickel silicide, platinum silicide, erbium silicide, or their combinations. Examples of metallic oxides include ruthenium oxide, indium tin oxide, or their combinations. Examples of metal include tungsten, titanium, aluminum, copper, molybdenum, nickel, platinum, alloys of these, combinations of these, or the like.

The gate electrode 807 may be deposited by chemical vapor deposition (CVD), sputter deposition, or other techniques known and used in the art for depositing conductive materials. The thickness of the gate electrode 807 may be in the range of about 200 angstroms to about 4,000 angstroms. The top surface of the gate electrode 807 may have a non-planar top surface, and may be planarized prior to patterning of the gate electrode 807 or gate etch. Ions may or may not be introduced into the gate electrode 807 at this point. Ions may be introduced, for example, by ion implantation techniques.

Once formed, the first passivation layer 801, the second passivation layer 803, the gate dielectric 805, and the gate electrode 807 may be patterned to form the gate stack 800 over the channel region 301. The gate stack 800 defines multiple channels located in the channel region 301 underneath the gate dielectric 805. The gate stack 800 may be formed by depositing and patterning a gate mask (not shown) on the gate electrode 807 using, for example, deposition and photolithography techniques known in the art. The gate mask may incorporate commonly used masking materials, such as (but not limited to) photoresist material, silicon oxide, silicon oxynitride, and/or silicon nitride. The gate electrode 807, the gate dielectric 805, the second passivation layer 803, and the first passivation layer 801 may be etched using a dry etching process to form the patterned gate stack 800.

However, while the above description illustrates specific embodiments with specific materials and processes, these embodiments are not intended to be limiting upon the embodiments. For example, in another embodiment the insulator layer 203 may comprise AlAsSb or AlSb while the first layer 303 may comprise $InAs_{1-x}Sb_x$, the second layer 403 may comprise $In_yGa_{1-y}Sb$, the second passivation layer 803 may comprise $Ga_2O_3$, and the gate dielectric 805 may comprise $Al_2O_3$ or $HfO_2$. In yet another embodiment the insulator layer 203 may comprise InP or $Al_{0.52}Ga_{0.48}As$ while the first layer 303 may comprise InGaAs, the second layer 403 may comprise InP, the second passivation layer 803 may comprise $TaSiO_x$, and the gate dielectric 805 may comprise $Al_2O_3$, or $HfO_2$, or $TaSiO_x$. All of these combinations and any other suitable combination are fully intended to be included within the scope of the embodiments.

Figure 9A:
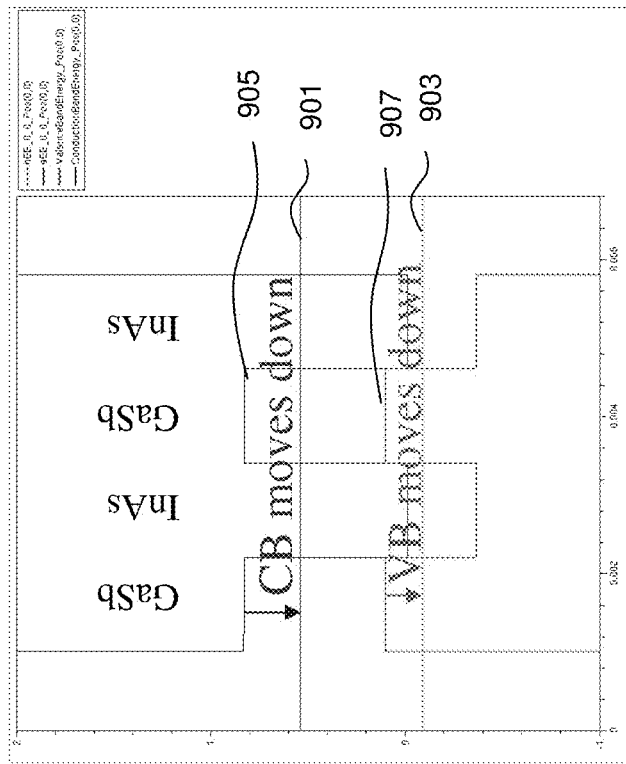
FIGS. 9A-9B illustrate a modulation of the channel region for a pFET type of transistor in accordance with an embodiment.
Figure 9B:
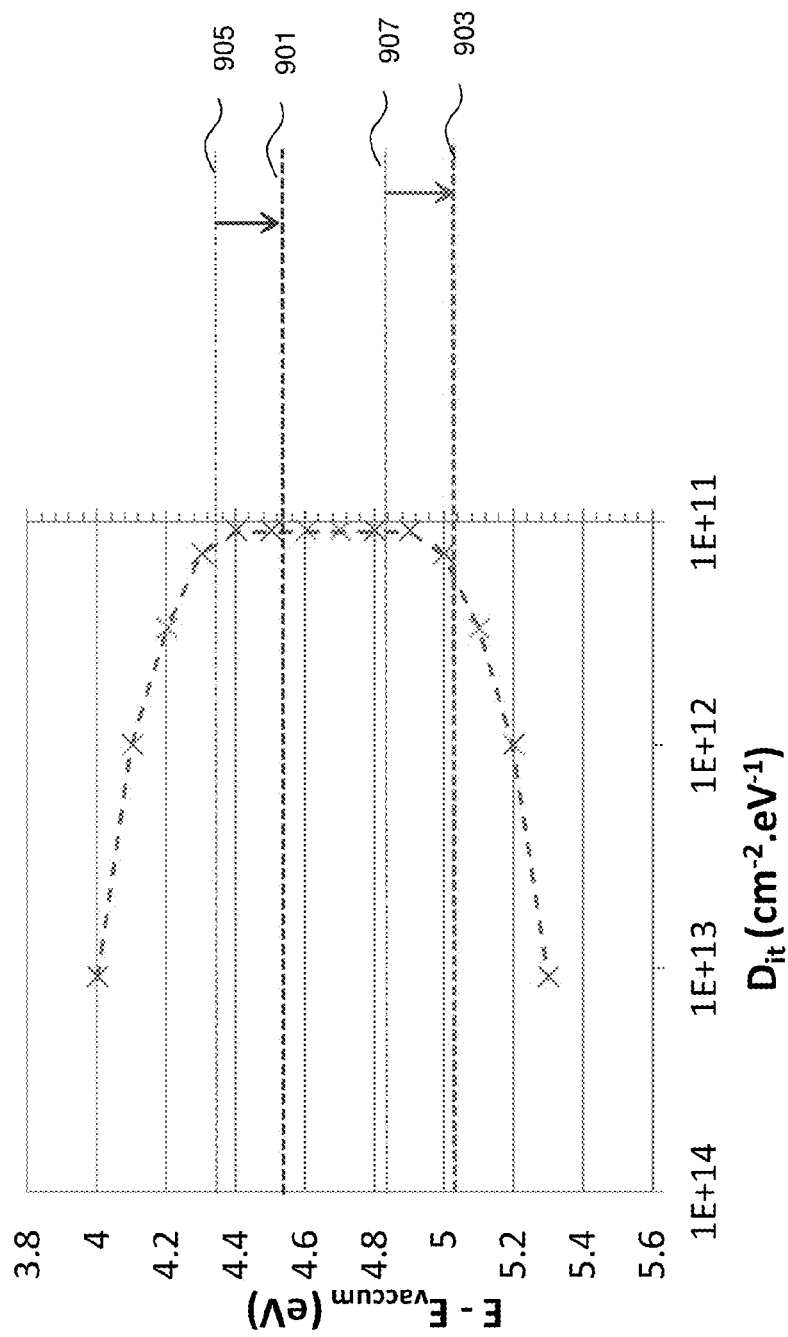

FIGS. 9A-9B illustrate the tuning of the channel region 301 as it would relate to a pFET. In particular, while the embodiments described above were described as moving the conduction bands and valence bands of the material in the first layer 303 (e.g., InAs) up in order to be used for an nFET, the embodiments could just as easily be described as shifting the conduction bands and valence bands of the material in the second layer 401 (e.g., GaSb) down. As can be seen in FIG. 9A, the conduction band 901 and the valence band 903 of the channel region 301 is lowered from the GaSb conduction band 905 and the GaSb valence band 907, respectively. Further, as shown in FIG. 9B, when this lowering is plotted against the interface trap density, the band gap of the overall channel region 301 remains within a region of low interface trap density, leading to a healthy operation of the pFET.

In accordance with an embodiment, a semiconductor device comprising a channel region on a substrate is provided. The channel region comprises a first layer on the substrate, the first layer comprising a first III-V material, the first III-V material having a first band gap, and a second layer on the first layer, the second layer comprising a second III-V material, the second III-V material having a second band gap different from the first band gap, a third layer on the second layer, the third layer comprising the first III-V material, and a fourth layer on the third layer, the fourth layer comprising the second III-V material. A gate stack is over the channel region.

In accordance with another embodiment, a semiconductor device comprising a first bi-layer on a substrate is provided. The first bi-layer comprises a first layer comprising indium and a second layer comprising gallium. A second bi-layer is on the first bi-layer, the second bi-layer comprising a third layer comprising indium over the first bi-layer and a fourth layer comprising gallium over the third layer. A gate dielectric is on the second bi-layer, and a gate electrode is on the gate dielectric.

In accordance with another embodiment, a method of manufacturing a semiconductor device comprising growing a first layer over a substrate, the first layer comprising a first III-V material, and growing a second layer on the first layer, the second layer comprising a second III-V material different from the first III-V material, is provided. The growing the first layer and the growing the second layer are repeated one or more times to form a channel region, and a gate stack is formed over the channel region, the gate stack comprising a gate dielectric and a gate electrode.

Although the present embodiments and their advantages have been described in detail, it should be understood that various changes, substitutions and alterations can be made herein without departing from the spirit and scope of the disclosure as defined by the appended claims. For example, the precise materials used in the insulator layer, the first layer, the second layer may be altered, and the precise methods of formation may also be altered while still remaining within the scope of the embodiments.

Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor device comprising:
   a channel region on a substrate, the channel region comprising:
      a first layer on the substrate, the first layer comprising a first III-V material, the first III-V material having a first band gap, wherein the first layer has a thickness between about 0.6 nm and about 1.2 nm;
      a second layer on the first layer, the second layer comprising a second III-V material, the second III-V material having a second band gap different from the first band gap, wherein the channel region has an effective band gap different from the first band gap and the second band gap, and wherein the second layer has a thickness between about 0.6 nm and about 1.2 nm;
      a third layer on the second layer, the third layer comprising the first III-V material; and
      a fourth layer on the third layer, the fourth layer comprising the second III-V material; and
   a gate stack over the channel region, wherein the gate stack comprises:
      a gate dielectric over the channel region, wherein an interface between the channel region and the gate dielectric has an interface trap density, and wherein the interface trap density at a lowest energy of the effective band gap of the channel region is between about $1E+11$ $cm^{-2}.eV^{-1}$ and about $1E+12$ $cm^{-2}.eV^{-1}$; and
      a gate electrode over the gate dielectric.

2. The semiconductor device of claim 1, wherein the channel region is part of a finFET.

3. The semiconductor device of claim 1, wherein the channel region is part of a planar transistor.

4. The semiconductor device of claim 1, wherein the first III-V material is InAs and the second III-V material is GaSb.

5. The semiconductor device of claim 1, wherein the first III-V material is $InAs_{1-x}Sb_x$ and the second III-V material is $In_yGa_{1-y}Sb$.

6. The semiconductor device of claim 1, wherein the first III-V material is InGaAs and the second III-V material is InP or InAlAs.

7. The semiconductor device of claim 1, wherein the first layer is four monolayers.

8. The semiconductor device of claim 1, wherein the first layer has a first thickness and the second layer has a second thickness different from the first thickness.

9. The semiconductor device of claim 1, further comprising:
   a template layer between the first layer and the substrate; and
   an insulator layer between the template layer and the first layer, wherein the insulator layer comprises AlAsSb.

10. A semiconductor device comprising:
    a first bi-layer on a substrate, the first bi-layer comprising:
       a first layer comprising indium; and
       a second layer comprising gallium over the first layer;
    a second bi-layer on the first bi-layer, the second bi-layer comprising:
       a third layer comprising indium over the first bi-layer; and
       a fourth layer comprising gallium over the third layer, wherein the first bi-layer and the second bi-layer form a channel region on the substrate, and wherein the channel region has an effective band gap between a band gap of indium and a band gap of gallium;
    a gate dielectric on the second bi-layer, wherein an interface between the channel region and the gate dielectric has an interface trap density, and wherein the interface trap density at a lowest enemy of the effective band gap of the channel region is between about $1E+11$ $cm^{-2}.eV^{-1}$ and about $1E+12$ $cm^{-2}.eV^{-1}$;
    a gate electrode on the gate dielectric;
    an insulator layer located between the first bi-layer and the substrate; and
    a template layer located between the insulator layer and the substrate, wherein the template layer comprises a III-V material and wherein the insulator layer and the template layer have sidewalls aligned with at least a portion of the first bi-layer.

11. The semiconductor device of claim 10, wherein the first layer is InAs and the second layer is GaSb.

12. The semiconductor device of claim 10, wherein the channel region further comprises:
    a third bi-layer;
    a fourth bi-layer on the third bi-layer; and a fifth bi-layer on the fourth bi-layer, wherein the third bi-layer, the fourth bi-layer, and the fifth bi-layer are interposed between the first bi-layer and the second bi-layer.

13. The semiconductor device of claim 10, wherein the insulator layer comprises AlAsSb.

14. The semiconductor device of claim 10, wherein the template layer comprises InAs.

15. The semiconductor device of claim 10, further comprising an isolation region on the substrate, wherein the isolation region extends along a sidewall of the insulator layer and a sidewall of the template layer.

16. A semiconductor device comprising:
a gate stack over a substrate, wherein the gate stack comprises:
a gate dielectric over the substrate; and
a gate electrode over the gate dielectric; and
a channel region under the gate stack, wherein the channel region further comprises:
two or more first layers, wherein each of the two or more first layers comprises a first III-V material and has a thickness between about 0.6 nm and about 1.2 nm; and
one or more second layers, wherein a first one of the one or more second layers is located between two of the two or more first layers, wherein each of the one or more second layers comprises a second III-V material different from the first III-V material, wherein an interface between the channel region and the gate dielectric has an interface trap density, and wherein the interface trap density at a lowest energy of an effective band gap of the channel region is between about $1E+11$ $cm^{-2}.eV^{-1}$ and about $1E+12$ $cm^{-2}.eV^{-1}$.

17. The semiconductor device of claim 16, wherein the first III-V material is InAs.

18. The semiconductor device of claim 17, wherein the second III-V material is GaSb.

19. The semiconductor device of claim 16, wherein the channel region is part of a planar transistor.

20. The semiconductor device of claim 16, further comprising an insulator layer located between the two or more first layers and the substrate.

* * * * *